United States Patent
DeBrosse

(10) Patent No.: US 9,666,258 B2
(45) Date of Patent: May 30, 2017

(54) BIT LINE CLAMP VOLTAGE GENERATOR FOR STT MRAM SENSING

(71) Applicant: INTERNATIONAL BUSINESS MACHINES CORPORATION, Armonk, NY (US)

(72) Inventor: John K. DeBrosse, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/823,828

(22) Filed: Aug. 11, 2015

(65) Prior Publication Data

US 2017/0047102 A1    Feb. 16, 2017

(51) Int. Cl.
| G11C 11/00 | (2006.01) |
| G11C 11/16 | (2006.01) |
| G11C 11/4094 | (2006.01) |
| G11C 7/12 | (2006.01) |

(52) U.S. Cl.
CPC .......... *G11C 11/1673* (2013.01); *G11C 7/12* (2013.01); *G11C 11/4094* (2013.01)

(58) Field of Classification Search
CPC ............................ G11C 7/12; G11C 11/4094
USPC .................................................. 365/189.06
See application file for complete search history.

(56) References Cited

U.S. PATENT DOCUMENTS

| 6,600,690 B1 | 7/2003 | Nahas et al. |
| 6,700,814 B1 | 3/2004 | Nahas et al. |
| 6,946,882 B2 | 9/2005 | Gogl et al. |
| 7,239,537 B2 | 7/2007 | DeBrosse et al. |
| 7,453,742 B2 * | 11/2008 | Maejima ............... G11C 16/24 365/185.21 |
| 7,760,201 B2 | 7/2010 | Couture-Gagnon |
| 7,898,840 B2 | 3/2011 | Maejima |
| 8,228,709 B2 * | 7/2012 | Choi ..................... G11C 7/22 365/148 |
| 9,153,335 B2 * | 10/2015 | Murakami ............ G11C 16/24 |

OTHER PUBLICATIONS

Jefremow, et al., "ISSCC 2013 / Session 12 / Non-Volatile Memory Solutions / 12.4", 2013 IEEE International Solid-State Circuits Conference, Feb. 2013, 3 pages.
Na et al., "Reference-Scheme Study and Novel Reference Scheme for Deep Submicrometer STT-RAM", IEEE Transactions on Circuits and Systems, vol. 61, No. 12, Dec. 2014, pp. 3376-3385.

* cited by examiner

*Primary Examiner* — Son Mai
(74) *Attorney, Agent, or Firm* — Tutunjian & Bitetto, P.C.; Vazken Alexanian

(57) ABSTRACT

A bit line clamp voltage generator circuit for a Spin Torque Transfer Magnetoresistive Random Access Memory is provided. The circuit includes a negative channel Field Effects Transistor having a source, a drain, and a gate, the gate being connected to the drain. The circuit further includes a resistor Rs having a first end connected to a first voltage and a second end connected to the source. The circuit also includes a resistor Rd having a first end connected to a second voltage and a second end connected to the drain to form an output node for outputting a bit line clamp voltage.

18 Claims, 4 Drawing Sheets ic Tunnel Junction (MTJ) in series with a Field
BIT LINE CLAMP VOLTAGE GENERATOR FOR STT MRAM SENSING

BACKGROUND

Technical Field

The present invention relates generally to information processing and, in particular, to a bit line clamp voltage generator for Spin Torque Transfer (STT) Magnetoresistive Random Access Memory (MRAM) sensing.

Description of the Related Art

STT MRAM is an attractive emerging memory technology, offering non-volatility, high performance and high endurance. The STT MRAM memory cell typically includes a Magnet Effect Transistor (FET) which is gated by the Word Line (WL). The Bit Line (BL) and Source Line (SL) run parallel to each other and perpendicular to the WL. The BL is connected to the MTJ and the SL is connected to the FET.

One cell along the BL is selected by turning on its WL. When a relatively large voltage is forced across the cell from BL to SL, the selected MTJ is written into a particular state. The written state is determined by the polarity of this voltage (BL high versus SL high).

When the cell is in the 0 or parallel state, the resistance of the MTJ is lower than when in the 1 or anti-parallel state. The selected cell is read by sensing the resistance from BL to SL. The sensing or read voltage must be much lower than the write voltage to avoid disturbing the cell. The state-dependent change in resistance is characterized by the parameter MR or magnetoresistance.

Many STT MRAM sensing techniques utilize a current sensing technique, in which an NFET, biased as a source follower, drives the sense amplifier (SA) input to the target read voltage. The resulting cell current is dropped through a PFET load device to produce a voltage which is detected by a comparator.

In these conventional STT MRAM sensing techniques, the generation of the gate voltage of the NFET source follower device (herein referred to as BLCLAMP) is critical to the operation of the sense amplifier, and presents considerable design challenges. If the BLCLAMP voltage is too large, the SA input voltage (Vsain) will be greater than the target, increasing the probability of read disturbs. If the BLCLAMP voltage is too small, the SA input voltage will be less than the target, reducing the magnitude of the signal and hence the read margin.

If BLCLAMP is a global reference, meaning that it is generated once per chip and distributed throughout the chip, the SA input voltage at each SA will depend strongly upon the NFET threshold voltage at each particular SA. In other words, Vsain will be dependent upon the long-range or cross-chip matching characteristics of the NFET device. Such long range matching characteristics are known to be quite poor and almost certainly result in an unacceptably wide distribution of the SA input voltage.

To avoid long-range device matching characteristics from affecting the SA input voltage, it is necessary to generate the BLCLAMP voltage locally, either for each individual SA or for a relatively small number of SAs which are in close proximity. However, if this is the case, then the circuit which generates BLCLAMP must be quite small and consume very little power, as many instances of the circuit will be required.

Conventional circuits for generating BLCLAMP are too large and draw too much current to be replicated many times per chip. The various feedback loops in these circuits imply a relatively long settling time for these circuits, implying that the circuits must be left on continuously, hence contributing to standby current. Additionally, the use of MTJs in the bias circuit may represent a reliability exposure, as these MTJs experience a much higher duty factor than the MTJs in the memory array.

SUMMARY

According to an aspect of the present principles, a bit line clamp voltage generator circuit for a Spin Torque Transfer Magnetoresistive Random Access Memory is provided. The circuit includes a negative channel Field Effects Transistor having a source, a drain, and a gate, the gate being connected to the drain. The circuit further includes a resistor Rs having a first end connected to a first voltage and a second end connected to the source. The circuit also includes a resistor Rd having a first end connected to a second voltage and a second end connected to the drain to form an output node for outputting a bit line clamp voltage.

According to another aspect of the present principles, a bit line clamp voltage generator circuit for a Spin Torque Transfer Magnetoresistive Random Access Memory is provided. The circuit includes a negative channel Field Effects Transistor having a source, a drain, and a gate, the gate being connected to the drain. The circuit further includes a resistor Rs having a first end connected to a first voltage and a second end connected to the source. The circuit also includes a resistor Rd having a first end connected to a second voltage and a second end connected to the drain to form an output node for outputting a bit line clamp voltage. The circuit additionally includes a first switching transistor for selectively connecting the resistor Rd to the second voltage in a circuit enable mode and disconnecting the resistor Rd from the second voltage in a circuit disable mode. The circuit further includes a second switching transistor for selectively inhibiting a pulling down of the output node in the circuit enable mode and pulling down the output node in the circuit disable mode.

According to yet another aspect of the present principles, a method for generating a bit line clamp voltage for a Spin Torque Transfer Magnetoresistive Random Access Memory is provided. The method includes providing a negative channel Field Effects Transistor having a source, a drain, and a gate, the gate being connected to the drain. The method further includes providing a resistor Rs having a first end connected to a first voltage and a second end connected to the source. The method also includes providing a resistor Rd having a first end connected to a second voltage and a second end connected to the drain to form an output node for outputting a bit line clamp voltage. The bit line clamp voltage is output from the output node responsive to application of the first voltage and the second voltage.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles are directed to a bit line clamp voltage generator for Spin Torque Transfer (STT) Magnetoresistive Random Access Memory (MRAM) sensing.

In an embodiment, the present principles provide a circuit for generating the BLCLAMP voltage which provides good control of the sense amplifier (SA) input voltage and consumes little area and power. The circuit has the additional advantages of a fast settling time, negligible standby current and provides a convenient way to disable the SAs when they are not in use.

Figure 1:
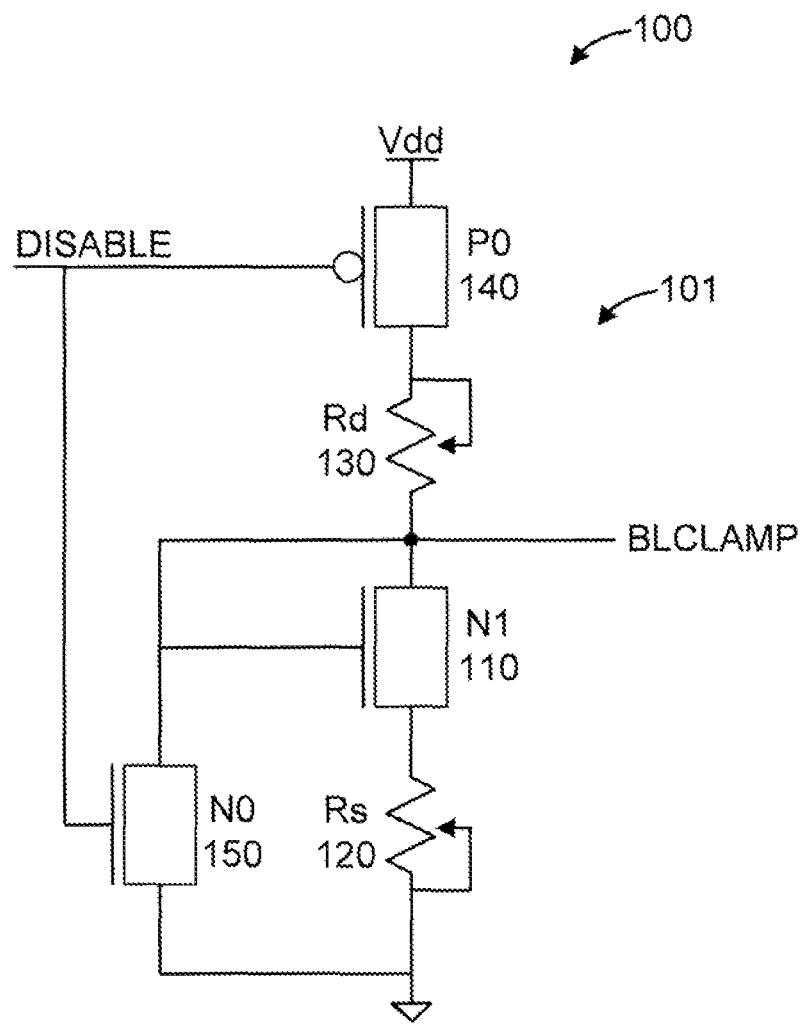
FIG. 1 shows an exemplary bit line clamp voltage generator circuit 100 for a Spin Torque Transfer (STT) Magnetoresistive Random Access Memory (MRAM), in accordance with an embodiment of the present principles.

FIG. 1 shows an exemplary bit line clamp voltage generator circuit 100 for a Spin Torque Transfer (STT) Magnetoresistive Random Access Memory (MRAM), in accordance with an embodiment of the present principles.

The bit line clamp voltage generator circuit 100 includes a diode-connected negative channel Field Effects Transistor (NFET) N1 110, a resistor Rs 120, a resistor Rd 130, a positive channel Field Effects Transistor (PFET) transistor P0 140, and an NFET N0 150. The PFET P0 140 is interchangeably referred to herein as the first switching transistor and the NFET N0 150 is interchangeably referred to herein as the second switching transistor.

The bit line clamp voltage generator circuit 100 can be considered to include a circuit core 101 that includes the diode-connected (gate tied to drain) NFET N1 110 with resistor Rs 120 connected from its source to ground and resistor Rd 130 connected to its drain. In an embodiment, NFET N1 110 is designed to match the NFET source follower devices in the sensing amplifier (SA).

Transistor P0 140 and transistor N0 150 operate as switches, providing a way to disable the generator 100 when not in use. Transistor P0 140 disconnects Rd 130 from Vdd when the circuit is not in use. Transistor N0 150 pulls BLCLAMP to ground when the generator 100 is not in use.

Resistor Rs 120 is chosen to closely match the total resistance from the SA input to ground including the cell and all parasitic series resistances. Resistor Rd 130 is chosen to be much larger than resistor Rs 120. Resistor Rs 120 and resistor Rd 130 can be trimmed using conventional digital trimming techniques if necessary. In an embodiment, resistor Rs 120 and resistor Rd 130 are constructed using identical links of polysilicon, diffusion or other resistor material available in the technology, such that the ratio of resistor Rs 120 to resistor Rd 130 is very well controlled even if their individual values are not.

Presuming that resistor Rs 120 and NFET N1 110 accurately match their equivalents within the SA, the SA input voltage is given by the following:

$$V\text{sain} = (Vdd - Vt - Vod) * Rs/Rt \quad (1)$$

where:

$$Vod = (\text{sqrt}(1 + 4*K*Rt*(Vdd-Vt)) - 1)/(2*K*Rt)$$

$$Rt = Rs + Rd$$

where:
Vt=threshold voltage of the NFET source follower device;
k=the transconductance of the NFET source follower device;
Vod=overdrive voltage (Vgs−Vt) of the NFET source follower device;
Vgs is the gate-to-source voltage of the NFET source follower device;
Vt, Vod, K, and Vgs, all refer to NFET N1 110.

For a well-engineered design, Vt and Vod are small relative to Vdd and relatively constant, such that the term in parentheses in Equation (1) is relatively well-controlled. The second term, namely Rs/Rt, is simply a ratio of resistances, over which the designer has excellent control. Hence the SA input voltage is can be easily varied by the designer through the choice of resistor Rd 120, and the resulting SA input voltage is well-controlled.

As a simple example of the power of this technique in accordance with an exemplary embodiment, presume the following nominal values:
Vdd=1.0V
Vt=300 mV
Vod=200 mV
Vsain=50 mV
Also assume the long-range variation of Vt is +/−100 mV.

It is to be appreciated that the preceding values are merely illustrative and other values can be used, while maintaining the spirit of the present principles.

For globally-distributed BLCLAMP, a simple analysis (using the well-known square law FET current model, i.e., Ids=K*(Vgs−Vt)^2) suggests that Vsain would vary by +/−66% of its nominal value, an unacceptable amount.

A similar analysis for the technique in accordance with the present principles using Equation (1) suggests that Vsain would vary by +/−17% of its nominal value, providing approximately a 4× improvement over the conventional technique involving the well-known square law FET current model.

It has been shown that bit line clamp voltage generator circuit 100 provides good control of the sense amplifier input voltage. The bit line clamp voltage generator circuit 100 is also more area and power efficient than conventional STT MRAM sensing circuits which involve one or more feedback amplifiers.

An additional advantage of bit line clamp voltage generator circuit 100 involves the settling time upon enabling the circuit 100. Some conventional STT MRAM sensing circuits involve complex multiple-pole feedback loops to control BLCLAMP. These loops must be carefully designed to avoid stability issues such as overshoot and ringing. Overshoot is particularly undesirable since the transient response occurs at the start of each sensing cycle and hence any overshoot would increase the probability of a read disturb. Such stability concerns limit the sensing speed that can be achieved with this technique.

By contrast, bit line clamp voltage generator circuit 100 involves a simple, single-pole response. Upon being enabled, BLCLAMP quickly moves to its final value, without the possibility of overshoot or ringing. Hence, bit line clamp voltage generator circuit 100 is more robust and potentially faster than the prior art for at least this reason.

Finally, when not sensing data, the BLCLAMP generator and the SA itself should be shut down so as to avoid contributing to standby power. Since bit line clamp voltage generator circuit 100 drives BLCLAMP to ground when disabled, the BLCLAMP generator and the SA itself draw no circuit current and their standby currents are limited to subthreshold and other device leakage. This is true for many conventional SA designs.

A description will now be given of other embodiments of the present principles.

In an embodiment, the width of NFET N1 110 and the values of 1/Rs and 1/Rd could be scaled up or down relative to their counterparts within the SA. In an embodiment, a designer could choose to scale down to reduce circuit current or up to improve transient response time.

In an embodiment, during the sensing period, the SA input could be connected to the SL as opposed to the BL as described. There are various considerations regarding BL versus SL sensing, the present principles can be applied to either arrangement.

Figure 2:
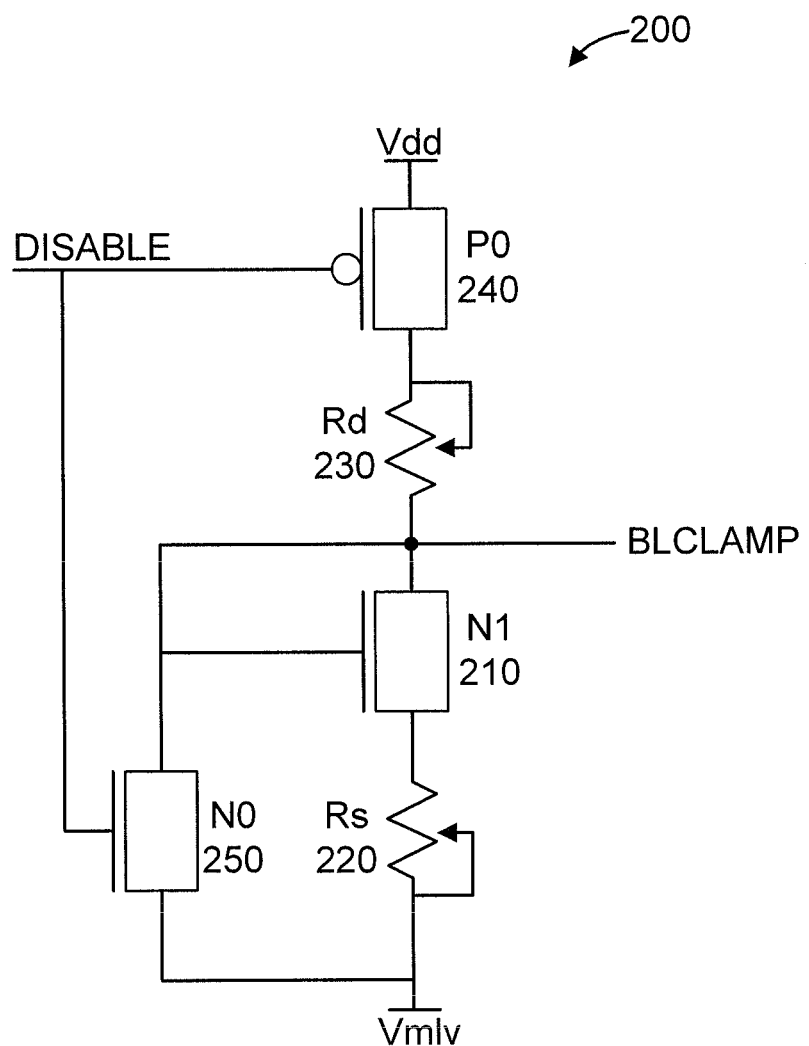
FIG. 2 shows an exemplary bit line clamp voltage generator circuit 200 for a Spin Torque Transfer (STT) Magnetoresistive Random Access Memory (MRAM), in accordance with an embodiment of the present principles.

In an embodiment, sensing could be performed relative to a mid-level voltage as shown in FIG. 2, as opposed to ground as shown in FIG. 1. In this case, resistor Rs would be connected to this mid-level voltage Vmlv as opposed to ground. This mid-level voltage Vmlv can be between VDD and ground.

FIG. 2 shows another exemplary bit line clamp voltage generator circuit 200 for a Spin Torque Transfer (STT) Magnetoresistive Random Access Memory (MRAM), in accordance with an embodiment of the present principles.

The bit line clamp generator circuit 200 of FIG. 2 is similar to bit line clamp generator circuit 100 of FIG. 1, except that the source and first end of resistor Rs are connected to a mid-level voltage Vmlv in FIG. 2 versus ground as shown in FIG. 1.

The bit line clamp voltage generator circuit 200 includes a diode-connected negative channel Field Effects Transistor (NFET) N1 210, a resistor Rs 220, a resistor Rd 230, a positive channel Field Effects Transistor (PFET) transistor P0 240, and an NFET N0 250. The PFET P0 240 is interchangeably referred to herein as the first switching transistor and the NFET N0 250 is interchangeably referred to herein as the second switching transistor.

Figure 3:
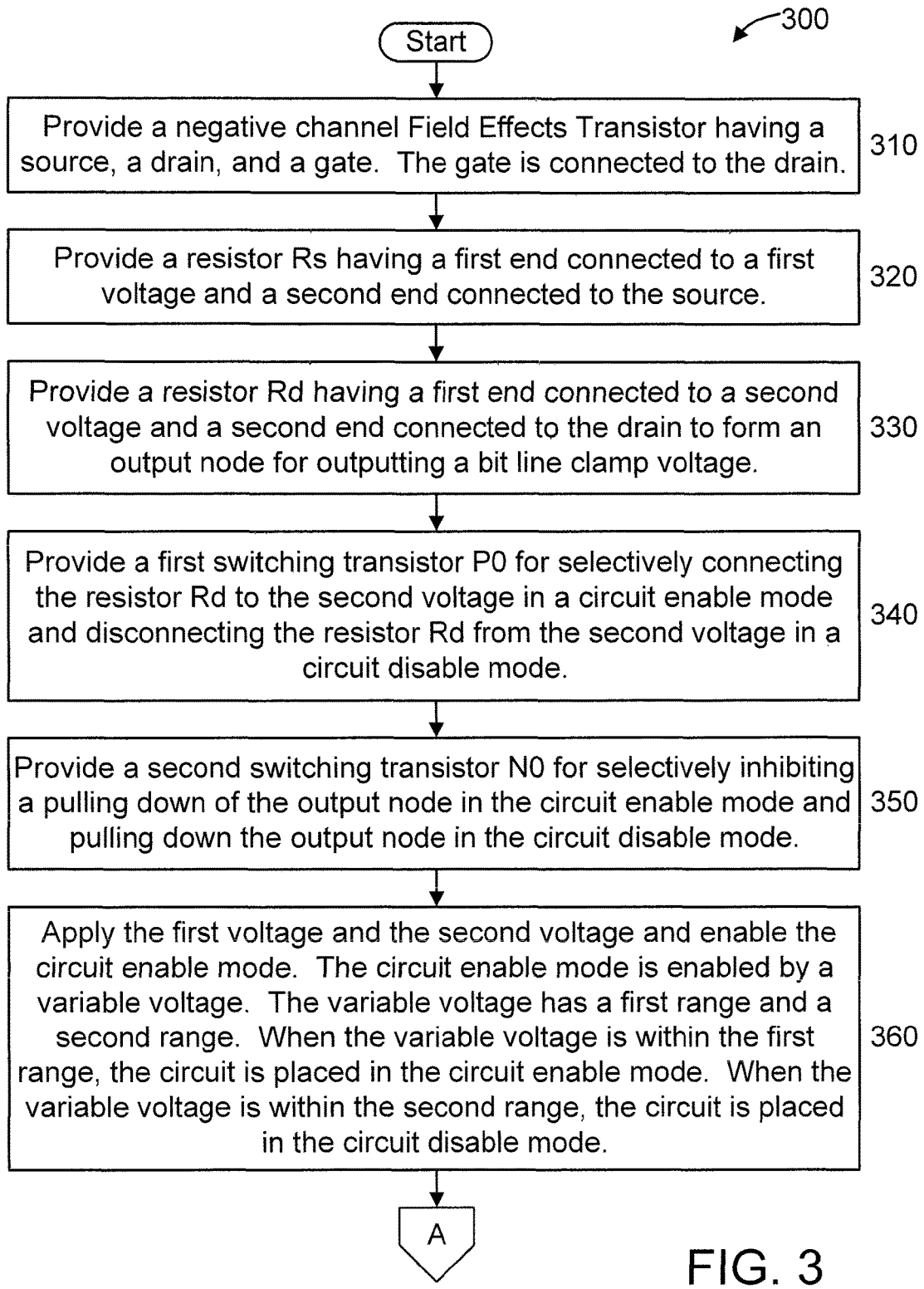
FIGS. 3-4 show an exemplary method 300 for generating a bit line clamp voltage for a Spin Torque Transfer (STT) Magnetoresistive Random Access Memory (MRAM), in accordance with an embodiment of the present principles.
Figure 4:
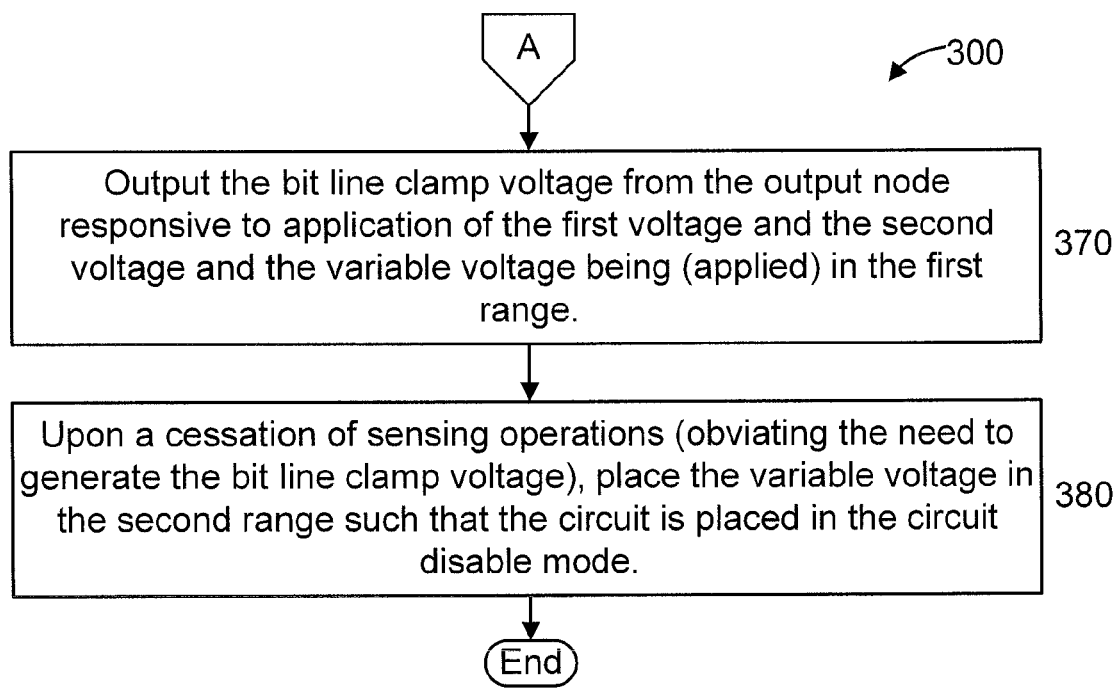

FIGS. 3-4 show an exemplary method 300 for generating a bit line clamp voltage for a Spin Torque Transfer (STT) Magnetoresistive Random Access Memory (MRAM), in accordance with an embodiment of the present principles.

At step 310, provide a negative channel Field Effects Transistor having a source, a drain, and a gate. The gate is connected to the drain.

At step 320, provide a resistor Rs having a first end connected to a first voltage and a second end connected to the source.

At step 330, provide a resistor Rd having a first end connected to a second voltage and a second end connected to the drain to form an output node for outputting a bit line clamp voltage.

At step 340, provide a first switching transistor P0 for selectively connecting the resistor Rd to the second voltage in a circuit enable mode and disconnecting the resistor Rd from the second voltage in a circuit disable mode.

At step 350, provide a second switching transistor N0 for selectively inhibiting a pulling down of the output node in the circuit enable mode and pulling down the output node in the circuit disable mode.

At step 360, apply the first voltage and the second voltage and enable the circuit enable mode. In an embodiment, the circuit enable mode is enabled by a variable voltage. The variable voltage has a first range and a second range. When the variable voltage is within the first range, the circuit is placed in the circuit enable mode. When the variable voltage is within the second range, the circuit is placed in the circuit disable mode.

At step 370, output the bit line clamp voltage from the output node responsive to application of the first voltage and the second voltage and the variable voltage being (applied) in the first range.

At step 380, upon a cessation of sensing operations (thus obviating the need to generate the bit line clamp voltage), place the variable voltage in the second range such that the circuit is placed in the circuit disable mode.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B).

As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A bit line clamp voltage generator circuit for a Spin Torque Transfer Magnetoresistive Random Access Memory, the circuit comprising:
   a negative channel Field Effects Transistor having a source, a drain, and a gate, the gate being connected to the drain;
   a resistor Rs having a first end connected to a first voltage and a second end connected to the source;
   a resistor Rd having a first end connected to a second voltage and a second end connected to the drain to form an output node for outputting a bit line clamp voltage; and
   a first switching transistor for selectively disconnecting the resistor Rd from the second voltage in a circuit disable mode; and
   a second switching transistor for selectively pulling down the output node in the circuit disable mode.

2. The bit line clamp voltage generator circuit of claim 1, wherein the first switching transistor has a drain connected the first end of the resistor Rd, a source connected to the second voltage, and a gate connected to a variable voltage.

3. The bit line clamp voltage generator circuit of claim 2, wherein the variable voltage has:

a first range for connecting the resistor Rd to the second voltage through the first switching transistor to enable the circuit in a circuit enable mode, and a second range for disconnecting the resistor Rd from the second voltage to disable the circuit in the circuit disable mode.

4. The bit line clamp voltage generator circuit of claim 1, wherein the second switching transistor has a drain connected to the output node, a source connected to the first voltage, and a gate connected to a variable voltage.

5. The bit line clamp voltage generator circuit of claim 4, wherein the variable, voltage has:

a first range for inhibiting a pulling down of the output node to enable the circuit in a circuit enable mode, and a second range for pulling down the output node to disable the circuit in the circuit disable mode.

6. The bit line clamp voltage generator circuit of claim 1, wherein gates of the first switching transistor and the second switching transistor are connected together.

7. The bit line clamp voltage generator circuit of claim 1, wherein the first switching transistor is a positive channel field effects transistor, and the second switching transistor is a negative channel field effects transistor.

8. The bit line clamp voltage generator circuit of claim 1, wherein the first voltage, to which the first end of the resistor Rs is connected, is a ground voltage.

9. The bit line clamp voltage generator circuit of claim 1, wherein the first voltage, to Which the first end of the resistor Rs is connected, is a non-grounded voltage.

10. The bit line clamp voltage generator circuit of claim 1, wherein the resistor Rd is larger than the resistor Rs.

11. The bit line clamp voltage generator circuit of claim 1, wherein at least one of the resistor Rs and the resistor Rd is a variable resistor.

12. A bit line clamp voltage generator circuit for a Spin Torque Transfer Magnetoresistive Random Access Memory, the circuit comprising:

a negative channel Field Effects Transistor having a source, a drain, and a gate, the gate being connected to the drain;

a resistor Rs having a first end connected to a first voltage and a second end connected to the source;

a resistor Rd having a first end connected to a second voltage and a second end connected to the drain to form an output node for outputting a bit line clamp voltage;

a first switching transistor for selectively connecting the resistor Rd to the second voltage in a circuit enable mode and disconnecting the resistor Rd from the second voltage in a circuit disable mode; and a second switching transistor for selectively inhibiting a pulling down of the output node in the circuit enable mode and pulling down the output node in the circuit disable mode.

13. The bit line clamp voltage generator circuit of claim 12, wherein the first switching, transistor has a drain connected to the first end of the resistor Rd, a source connected to the second voltage, and a gate connected to a variable voltage having a first range for enabling the circuit in the circuit enable mode and a second range for disabling the circuit in the circuit disable mode.

14. The bit line clamp voltage generator circuit of claim 12, wherein the second switching transistor has drain connected to the output node, a source connected to the first voltage, and a gate connected to a variable voltage having a first range for enabling the circuit in the circuit enable mode and a second range for disabling the circuit in the circuit disable mode.

15. The bit line clamp voltage generator circuit of claim 12, wherein gates of the first switching transistor and the second switching transistor are connected together.

16. The bit line clamp voltage generator circuit of claim 12, wherein the first switching transistor is a positive channel field effects transistor, and the second switching transistor is a negative channel field effects transistor.

17. The bit line clamp voltage generator circuit of claim 12, wherein the resistor Rd is larger than the resistor Rs.

18. A method for generating a bit line clamp voltage for a Spin Torque Transfer Magnetoresistive Random Access Memory, the method comprising:

providing a negative channel Field Effects Transistor having a source, a drain, and a gate, the gate being connected to the drain;

providing a resistor Rs having a first end connected to a first voltage and a second end connected to the source; and providing a resistor Rd having a first end connected to a second voltage and a second end connected to the drain to form an output node for outputting a bit line clamp voltage;

providing a first switching transistor to selectively disconnect the resistor Rd from the second voltage in a circuit disable mode; and providing a second switching transistor to selectively pull down the output node in the circuit disable mode, wherein the bit line clamp voltage is output from the output node responsive to application of the first voltage and the second voltage.

* * * * *